United States Patent [19]
Jeon et al.

[11] Patent Number: 6,159,646
[45] Date of Patent: Dec. 12, 2000

[54] REWORK METHOD UTILIZING THINNER FOR WAFERS IN MANUFACTURING OF SEMICONDUCTOR DEVICES

[75] Inventors: Mi-sook Jeon; Chun-deuk Lee; Bo-yong Lee, all of Yongin, Rep. of Korea

[73] Assignee: Samsung Electronics Co., Ltd., Suwon, Rep. of Korea

[21] Appl. No.: 09/148,160

[22] Filed: Sep. 4, 1998

[30] Foreign Application Priority Data

Sep. 4, 1997 [KR] Rep. of Korea ............ 97-45728
Mar. 23, 1998 [KR] Rep. of Korea ............ 98-10005

[51] Int. Cl.⁷ .................................................. G03F 9/00
[52] U.S. Cl. ................................... 430/30; 430/331
[58] Field of Search .............................. 430/30, 331

[56] References Cited

U.S. PATENT DOCUMENTS

| 5,426,017 | 6/1995 | Johnson | 430/331 |
| 5,543,262 | 8/1996 | Rahman et al. | 430/168 |
| 5,866,305 | 2/1999 | Chon et al. | 430/331 |

FOREIGN PATENT DOCUMENTS

| 0 754 975 A2 | 1/1997 | European Pat. Off. . |
| 0753 795 A1 | 1/1997 | European Pat. Off. . |
| WO 96/12214 | 4/1996 | WIPO . |
| WO 97/00465 | 1/1997 | WIPO . |
| WO 97/02958 | 1/1997 | WIPO . |

OTHER PUBLICATIONS

Patent Abstracts of Japan, Pub. No. 06308734, Publication Date Apr. 1994.

*Primary Examiner*—Christopher G. Young
*Attorney, Agent, or Firm*—Jones Volentine, LLC

[57] ABSTRACT

A thinner composition for removing photoresist, a rework method for wafers, and a method of manufacturing semiconductor devices are provided. The thinner composition is applied for removing excess photoresist coated on the edge side or back side of wafer. The thinner may be a mixture of ethyl lactate (EL), ethyl-3-ethoxy propionate (EEP), and τ-butyro lactone (GBL), or a mixture of ethyl lactate (EL), and ethyl-3-ethoxy propionate (EEP), or a mixture of ethyl lactate (EL), and ethyl-3-ethoxy propionate (EEP). The rework process is carried out, using the above thinner compositions, on the wafers having excess coated photoresist due to an etching failure. The method of manufacturing semiconductor devices includes a rinsing step for removing the excess coated photoresist on the edge side or back side of wafer by using the above thinner compositions.

14 Claims, 9 Drawing Sheets

REWORK METHOD UTILIZING THINNER FOR WAFERS IN MANUFACTURING OF SEMICONDUCTOR DEVICES

BACKGROUND OF THE INVENTION

1. Field of the Invention

The present invention relates to a thinner composition for removing photoresist, a method for reworking wafers for manufacturing semiconductor devices using the thinner composition, and to a method of manufacturing semiconductor devices that includes rinsing selected areas of the wafer to remove unwanted photoresist. U.S. application Ser. Nos. 08/771,773 and 08/771,774, both filed on Dec. 20, 1996, are both hereby incorporated by reference in their entirety.

More particularly, the present invention relates to a thinner composition for selectively removing photoresist which is coated unnecessarily on the edges or the backside of the wafer, or for removing an entire photoresist layer where an etching failure occurred during photoetching of the semiconductor device. The thinner composition is either a mixture of Ethyl-3-Ethoxy Propionate (EEP), Ethyl Lactate (EL), and τ-Butyro Lactone (GBL), or a mixture of EEP and EL, or a mixture of EL and GBL. The present invention also includes a rework method for removing all of the unwanted photoresist coated on the wafer surface during manufacturing, and a method for manufacturing semiconductor devices that includes selectively rinsing photoresist that was unnecessarily coated on the edges or the backside of the wafer with the thinners of the present invention to remove the unwanted photoresist.

2. Description of the Related Art

A photoetching process is generally used to form a predetermined circuit pattern on a semiconductor substrate or on a specific layer that has already been formed over the semiconductor substrate during the fabrication processes. The photoetching process is typically carried out by coating photoresist onto the substrate which causes a photochemical reaction on the semiconductor substrate.

First, a primer is coated over the semiconductor substrate in order to improve the adhesiveness of the photoresist to the semiconductor substrate or to the specific layer that is being coated. Next, the photoresist is coated onto the primer.

After coating the photoresist, a rinsing step is carried out to remove unwanted photoresist that was deposited unnecessarily on the edges or backside of the semiconductor substrate.

Subsequently, a soft baking step is carried out to remove the solvent inside the photoresist coated on the semiconductor substrate, and to improve the adhesiveness of the photoresist to the semiconductor substrate. Thereafter, the photoresist is exposed and developed to create a predetermined photoresist pattern on the substrate.

The photoresist pattern formed as outlined above serves either as an etching mask for selectively etching the semiconductor substrate or a specific sub-layer, or as an ion-injection mask for injecting ions into the semiconductor substrate or the sub-layer in subsequent fabrication processes.

If the photoetching process results in an etching failure, all of the photoresist coated on the semiconductor substrate should be removed, and new photoresist should be recoated onto the substrate in order to reexecute the photoetching process. This is typically referred to as reworking the substrate.

The kinds of conventional thinners that are used to remove the photoresist in the rework process differ depending on the chemistry of the specific layer on which the pattern is to be formed. For example, if the layer to be patterned is a metallic layer, then sulfuric acid, or a mixture of sulfuric acid and hydrogen peroxide must be used in the rework process to strip off any unwanted photoresist before the metallic layer is formed, and N-butyl acetate must be used to remove the photoresist if the rework process is necessary due to an etching failure that occurs after the metallic layer has been formed.

In summary, sulfuric acid or a mixture of sulfuric acid and hydrogen peroxide cannot be used to remove unwanted photoresist from an existing metallic layer, and N-butyl acetate cannot be used to remove the photoresist before forming a metallic layer. As a result, a separate rework apparatus for each chemical is needed if these conventional thinners are used. Another complication can be encountered if the specific kind of photoresist being used is incompatible with the thinners, such as the N-butyl acetate, that were used in the rework process. In the conventional process, this incompatibility typically requires a different kind of chemical or rework apparatus depending on the kind of the photoresist employed. Using multiple apparatus decreases productivity. Therefore, there is a great need for new chemical thinners which are compatible with the rework process and the chosen photoresist, and which can be used to rework either a chemical or a metallic layer.

A rinsing step is typically carried out during manufacturing to remove any photoresist that is unnecessarily coated on the edges or the backside of the semiconductor substrate during the photoetching process. Unwanted photoresist remaining on the edges or the backside of the wafer can cause an etching failure, or can generate particle contamination during subsequent processing, such as during etching or ion-injection, thereby decreasing the production yield.

According to the conventional method, in order to remove the photoresist from the edges or backside of the wafer, spray nozzles are provided above and below the wafer edge so that a thinner comprising an organic solvent can be sprayed onto the edges or backside of the wafer. The performance of the thinner to selectively remove unwanted photoresist is determined by its solubility rate, volatility and viscosity.

The solubility rate of a thinner determines how effectively the thinner can dissolve and remove the photoresist. With respect to volatility, the thinner should be easily evaporated after removing the photoresist so that the thinner does not remain on the surface of the wafer as a potential source of pollution in subsequent processing steps. However, if the volatility is too high, the thinner will evaporate during handling before completely removing the photoresist, whereby the cleaning efficiency of the photoresist is lowered and contamination problems arise in the clean room. If the volatility of the thinner is too low, the thinner may remain on the edge portion of the wafers, particularly at the flat zone used in aligning the wafers after spin drying. If the thinner does not evaporate it will build-up on the photoresist layer after development causing a lump of photoresist to form in the flat zone portion which reduces the yield of semiconductor devices produced from the wafers.

Figure 1:
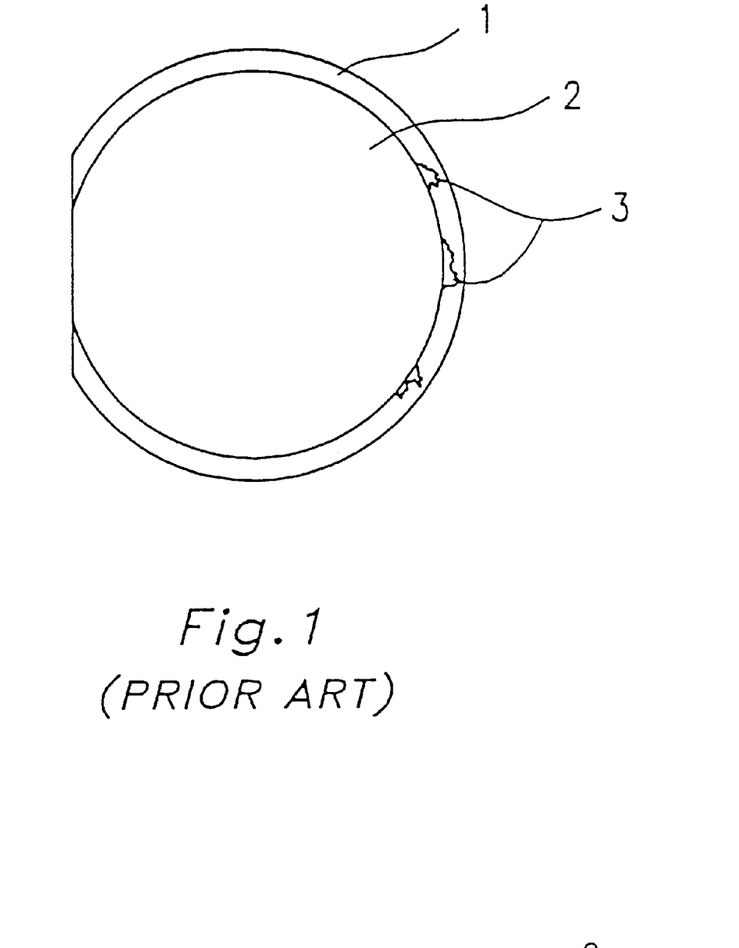
FIG. 1 is a plan view showing the tailing conditions which may be encountered in the cleaning step for rinsing unwanted photoresist coated from a wafer.
Figure 2:
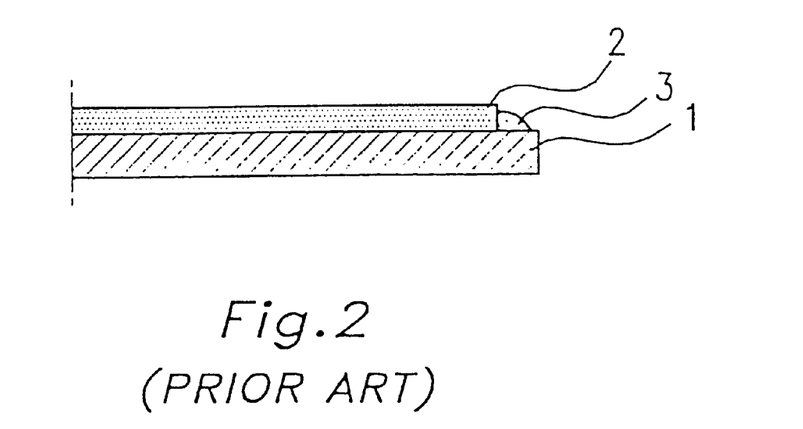
FIG. 2 is a cross-section of the wafer in FIG. 1.
Figure 3:
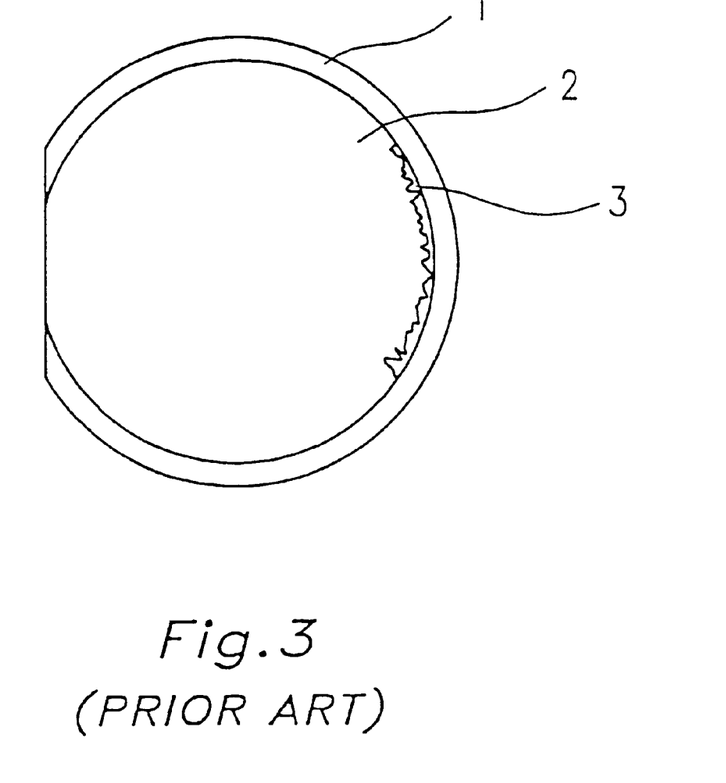
FIG. 3 is a plan view showing photoresist attack which may be encountered in the cleaning step for rinsing the unwanted photoresist coated from a wafer.
Figure 4:
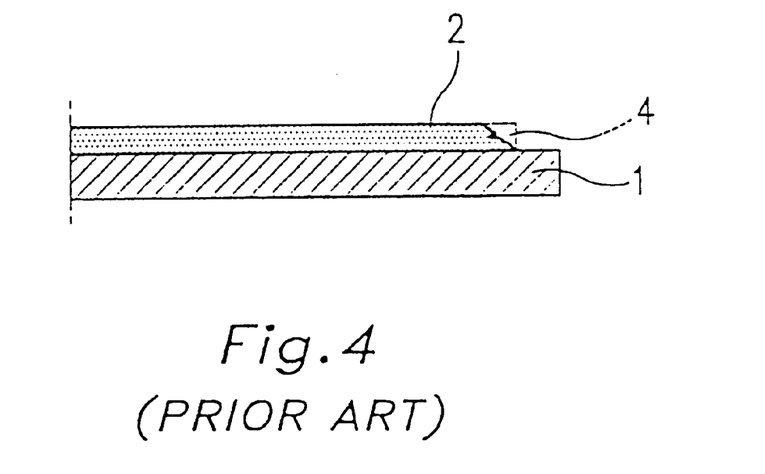
FIG. 4 is a cross-section of the wafer in FIG. 3.

Proper viscosity is essential to facilitate spraying the thinner through the nozzles. If the viscosity is too high, an excessively high spraying pressure is required. If viscosity is too low, the spray focus will deteriorate because the thinner cannot be concentrated or focused on the contact position of the wafer which interferes with the ability of the thinner to selectively remove unwanted photoresist during rinsing. Particularly, with respect to edge rinsing, the thinner must have the proper solubility rate in order to ensure a smooth wafer cross section after treatment. As shown in FIGS. 1 and 2, if the solubility rate is too low, a so-called tailing condition occurs. If the thinner has a low solubility, the flow of a partially solubilized photoresist tail 3 can occur while rinsing the photoresist 2 that was previously coated on the wafer 1. Alternatively, if the solubility rate is too high, erosion of the photoresist layer occurs. FIGS. 3 and 4 show an erosion portion 4 of the photoresist 2, a so-called photoresist attack, which may occur while rinsing the photoresist 2 coated onto the wafer 1. Both tailing and photoresist attack cause wafer defects, which reduce the yield of the semiconductor devices.

Conventional thinners, include ethyleneglycol monoethylether acetate (ECA), N-butyl acetate (N-BA), propyleneglycol monomethylether acetate (PGMEA) and ethyl lactate (EL). Both ethyleneglycol monoethylether acetate and N-butyl acetate have good solubility rates, however, their volatility and flammability are unacceptably high, further, these compounds are toxic to humans if inhaled or contacted on the skin. The toxic effects of ECA include leukopenia and miscarriage of an embryo. The solubility rate of propyleneglycol monomethylether acetate or ethyl lactate is too low to selectively rinse photoresist from the edges or backside of the wafer. A rinse method using a solvent comprising an ether compound represented by the general formula of $R^1$—O—(—$CHR^2$—$CH_2$—O—)$_n$—H was disclosed in Korean Patent Publication No. 90-5345, which is incorporated herein by reference. According to the publication, the rinse solvent is nontoxic. This solvent may be used to remove or peel off a photoresist layer by completely immersing a wafer coated with photoresist in the solvent. However, this solvent cannot be sprayed onto a wafer to selectively remove the unwanted photoresist (i.e., remove the photoresist from the edge and backside portions of the wafer) because the viscosity is too high.

Accordingly, there is a need for a nontoxic thinner that has the proper solubility, volatility, and viscosity rates for certain photoresists in a rework process or a rinse process for semiconductor manufacturing. There is also a need for a reliable rework method and a method of manufacturing semiconductor devices using the thinner.

SUMMARY OF THE INVENTION

The present invention provides a thinner composition for removing unwanted photoresist from a wafer substrate during the manufacture of semiconductor devices. The present invention further includes a method for selectively removing any photoresist that is unnecessarily coated onto the edges or back side of a wafer using the thinners, and a rework process to remove an entire photoresist layer where an etching failure occurs during photoetching.

To achieve these and other advantages, the present invention provides a thinner composition for removing photoresist from a wafer in the semiconductor device fabrication process, comprising a mixture of ethyl lactate and ethyl-3-ethoxy propionate. In a preferred embodiment, the composition comprises 60 to 80 weight percent of ethyl lactate and 20 to 40 weight percent of ethyl-3-propionate and the viscosity is in a range of from about 1.0 to about 2.0 cps. In another embodiment, the thinner composition is a mixture of ethyl lactate, τ-butyro lactone, and ethyl-3-ethoxy propionate, wherein the viscosity of the composition is in a range of from about 1.0 to about 2.0 cps. In other preferred embodiments, the composition comprises 10 to 70 weight percent of ethyl lactate, 30 to 80 weight percent of ethyl-3-ethoxy propionate, and less than or equal to 10 weight percent τ-butyro lactone; or 20 to 60 weight percent of ethyl lactate, 1 to 8 weight percent of τ-butyro lactone and 39 to 72 weight percent of ethyl-3-ethoxy propionate; or 20 to 40 weight percent of ethyl lactate, 2 to 6 weight percent of τ-butyro lactone, and 58 to 74 weight percent of ethyl-3-ethoxy propionate. The thinner of the present invention can also comprise a mixture of ethyl lactate and τ-butyro lactone.

In another aspect of the present invention, there is provided a rework method for removing a layer of photoresist from a wafer for manufacturing semiconductor devices, comprising a) carrying out the photoetching process after coating the photoresist onto a semiconductor substrate in order to form a predetermined pattern on the semiconductor substrate; b) examining the wafer to determine whether an etching failure has occurred; and c) removing the photoresist unsuccessfully coated on the semiconductor substrate if an etching failure during the photoetching process is detected by applying a thinner composition to the photoresist. In preferred embodiments, the thinner used to rework the wafer by removing the photoresist layer is a mixture of 70 to 80 weight percent of ethyl-3-ethoxy propionate, 17 to 23 weight percent of ethyl lactate, and 3 to 7 weight percent of τ-butyro lactone; or a mixture of 75 weight percent of ethyl-3-ethoxy propionate, 20 weight percent of ethyl lactate, and 5 weight percent of τ-butyro lactone. Thinner used to rework the photoresist can also be a mixture of 20 to 40 weight percent of ethyl-3-ethoxy propionate, and 60 to 80 weight percent of ethyl lactate; or mixture of 60 to 90 weight percent of ethyl lactate, and 10 to 40 weight percent of τ-butyro lactone.

The rework method of the present invention can further comprise d) loading the semiconductor substrate having the photoresist coated thereon onto a rotatable vacuum chuck; e) supplying the thinner to the photoresist coated on the semiconductor substrate; f) leaving the thinner on the semiconductor substrate for a sufficient time to dissolve the photoresist; and g) removing the photoresist and the thinner by rotating the vacuum chuck. The rework method can also be used to remove photoresist that was coated onto an insulating layer, such as a nitride or an oxide layer, or a metallic layer, such as aluminum.

In another aspect of the present invention, there is provided a method of manufacturing semiconductor devices, comprising a) coating a primer onto a semiconductor substrate to increase the adhesiveness of the semiconductor substrate to a photoresist; b) coating a photoresist onto the primer; c) rinsing the semiconductor substrate to remove any unnecessarily coated photoresist by applying a thinner composition to the photoresist that is to be removed; d) soft baking the semiconductor substrate to improve the adhesiveness of the photoresist to the semiconductor substrate; e) exposing the photoresist to form a predetermined pattern on the photoresist; and f) developing the exposed photoresist. In a preferred embodiment, the thinner used to rinse unnecessarily coated photoresist comprises a mixture of 70 to 80 weight percent of ethyl-3-ethoxy propionate, 17 to 23 weight percent of ethyl lactate, and 3 to 7 weight percent of τ-butyro lactone. In other embodiments, the thinner comprises a mixture of 75 weight percent of ethyl-3-ethoxy propionate, 20 weight percent of ethyl lactate, and 5 weight percent of τ-butyro lactone; or a mixture of 20 to 40 weight percent of ethyl-3-ethoxy propionate and 60 to 80 weight percent of ethyl lactate; or a mixture of 60 to 90 weight percent of ethyl lactate and 10 to 40 weight percent of τ-butyro lactone.

BRIEF DESCRIPTION OF THE DRAWINGS

The accompanying drawings illustrate embodiments of the invention, in which.

DETAILED DESCRIPTION OF THE PREFERRED EMBODIMENTS

Methods for reworking or manufacturing semiconductor devices to remove unwanted photoresist will be hereinafter described in detail with reference to FIG. 1–FIG. 12.

A Thinner Composition Comprising a Mixture of Ethyl Lactate (EL) and τ-Butyro Lactone (GBL)

The present invention includes a thinner composition comprising a mixture of 90 to 60 weight percent of ethyl lactate (EL) and 10 to 40 weight percent of τ-butyro lactone (GBL). The EL and GBL having a high purity are used after filtering through 0.2 μm sieve.

Ethyl lactate is recognized by the FDA (Food & Drug Administration) as an acceptable food additive. EL has an $LD_{50}$ (50 % of lethal dose in mice) of 2.5 g/kg when administered orally, proving its safety for human use. EL is quickly dissolved into lactic acid and ethanol and it has a density of 0.97 g/cm$^3$, a boiling point of 156° C., an ignition point (measuring by closed cup) of 52° C., and a viscosity (at 25° C.) of 2.7 cps (centi-poise).

Gamma-butyro lactone (GBL) is a stable solvent for synthetic resins which has a high ignition point. GBL has an $LD_{50}$ in rats of 1.5 g/kg when administered orally over a 3 month period proving the safety of GBL for human use and skin contact. GBL has a density of 1.128 g/cm$^3$, a boiling point of 204° C., an ignition point (measured by closed cup) of 100° C., and a viscosity (at 25° C.) of 1.7 cps.

The physical properties of a mixture of 80 weight percent of ethyl lactate (EL) and 20 weight percent of τ-butyro lactone (GBL) are: density 1.052 g/cm$^3$, boiling point 160° C., ignition point (measured by closed cup) 96 to 98° C., and viscosity (at 25° C.) 2.25 cps. These properties for the mixture EL:GBL are intermediate between those of each component. The mixture can be prepared to achieve a desired physical property by manipulating the concentration of the two components.

In a preferred embodiment according to the present invention, the mixing ratio by weight of the ethyl lactate (EL) and the τ-butyro lactone (GBL) is 90:10. In other preferred embodiments, the ratio of EL to GBL is 95:5, 80:20, 70:30, and 60:40. The solubility rate of the various EL:GBL compositions for photoresist, the volatility as an organic solvent, the corrosiveness as a cleaning solution used in a supply apparatus, and the effectiveness in rinsing edge beads of photoresist have been analyzed.

Results are also provided for propylene glycol monomethylester acetate (PGMEA), ethylene glycol monoethylester (ECA), ethy lactate (EL) and a mixture of ethyl lactate (EL) and τ-butyro lactone (GBL) at a ratio by weight of 95:5.

Solubility Rate for Photoresist

The solubility rate of various thinners was measured for several commercially available photoresists such as SS01A9 (Smimoto Chemical Company Ltd. (Japan)) and MCPR-i7010N (Kabusikikaisha Mitsubishi (Japan)). First, the photoresist is coated onto a silicon wafer at a thickness of 15,000 Å for SS01A9, and at the thickness of 14,000 Å for MCPR-i7010N. Then the wafer is soft-baked for 120 seconds at a temperature of 150° C. The thickness of the photoresist was measured using a measuring tool called an APC (LJC Company (Japan) model-790). The following thinners were tested: propylene glycol monomethylester acetate (PGMEA), ethylene glycol monoethylester (ECA), and the thinner composition of the present invention comprising 80 weight percent of ethyl lactate (EL) and 20 weight percent of τ-butyro lactone (GBL). The results are set forth in Table 1.

TABLE 1

Solubility rate of thinners for the photoresist (unit: Å/sec)

| Photoresist | Thinner Composition | | |
| --- | --- | --- | --- |
| | PGMEA | ECA | EL:GBL 80:20 |
| SS01A9 | 2,512 | 4,376 | 4,642 |
| MCPR-i7010N | 7,829 | 9,341 | 10,642 |

As shown in Table 1, the thinner composition of the present invention, EL:GBL 80:20, has a very high solubility rate compared with the conventional propylene glycol monomethylester acetate (PGMEA), and has a higher solubility rate than ethylene glycol monoethylester acetate (ECA).

The solubility rate of ethyl lactate (EL) alone for photoresist was compared to the solubility rates of various mixtures of ethyl lactate (EL) and τ-butyro lactone (GBL). The photoresist DSAM-200 was coated onto a wafer at a thickness of 12,250 Å, 15,000 Å, and 20,600 Å. The solubility rates were measured under the same conditions as above, except that soft-baking was conducted at a temperature of 100° C. for 90 seconds. The results are set forth in Table 2.

TABLE 2

The solubility rate of thinners for photoresist. (unit: Å/sec)

| Photoresist | EL | Thinner Composition | | | |
|---|---|---|---|---|---|
| | | EL:GBL 95:5 | EL:GBL 90:10 | EL:GBL 80:20 | EL:GBL 70:30 |
| DSAM-200 | 909 | 1,231 | 1,453 | 2,215 | 3,618 |

As shown in Table 2, the solubility rate for the photoresist increased as the content of τ-butyro lactone (GBL) in the thinner composition was increased. The solubility rate of the EL:GBL mixtures were significantly higher when compared to ethyl lactate (EL) alone.

Volatility of Thinners

The volatility of various organic solvents over time was measured under atmospheric pressure and at room temperature (25° C.). The results are set forth in Table 3.

TABLE 3

Volatility of the organic solvents over time in units of g/hour

| Time (hours) | Thinner (Organic solvents) | | | |
|---|---|---|---|---|
| | PGMEA | ECA | EL | GBL |
| 1 | −0.31 | −0.18 | −0.08 | −0.08 |
| 2 | −0.57 | −0.37 | −0.18 | −0.14 |
| 6 | −2.45 | −1.44 | −0.77 | −0.07 |
| 24 | −10.44 | −5.66 | −4.33 | 0.49 |

As shown in Table 3, the volatility of the organic solvents decreases in the following order: propylene glycol monomethyleter acetate (PGMEA)>>ethylene glycol monoethyleter acetate (ECA)>ethyl lactate (EL)>>τ-butyro lactone (GBL). The results also show that the respective components of the composition of the present invention, ethyl lactate (EL) and τ-butyro lactone (GBL), are both less volatile than the conventional organic solvents, PGMEA and ECA. The volatility of GBL is significantly lower than the other organic solvents. Note that with respect to GBL, the volatilized amount of the organic solvent measured after two hours from the start of the experiment (−0.14) was twice the amount measured after six hours (−0.07). This result appears to be caused by experimental error.

The volatility of various preferred embodiments the present invention was measured and the results are shown in Table 4.

TABLE 4

Volatilized Amounts of the Organic Solvents with Respect to the Mixing Ratio

| Time (hours) | EL:GBL 95:5 | EL:GBL 90:10 | EL:GBL 80:20 | EL:GBL 70:30 |
|---|---|---|---|---|
| 2 | −0.02 | −0.03 | −0.01 | −0.01 |
| 3 | −0.06 | −0.06 | −0.03 | −0.04 |
| 26 | −0.59 | −0.43 | −0.43 | −0.39 |

TABLE 4-continued

Volatilized Amounts of the Organic Solvents with Respect to the Mixing Ratio

| Time (hours) | EL:GBL 95:5 | EL:GBL 90:10 | EL:GBL 80:20 | EL:GBL 70:30 |
|---|---|---|---|---|
| 50 | −1.57 | −1.22 | −1.14 | −1.10 |
| 114 | −2.97 | −2.62 | −1.97 | −1.18 |

As shown in Table 4, the volatilized amount of the thinner decreases as the concentration of GBL increases for the mixture of ethyl lactate (EL) and τ-butyro lactone (GBL). In those compositions having over 20% by weight of τ-butyro lactone (GBL), the volatilized amounts did not vary significantly. Thus, adding GBL to EL decreases the volatility of organic solvent mixture, thereby decreasing the risk of inhalation of volatilized solvents by a worker and the danger of explosion in the clean room.

Swelling for Feeding Apparatus

Various samples of synthetic resins used to make O-rings were immersed in a mixture of ethyl lactate (EL) and τ-butyro lactone (GBL), respectively, for over 150 hours to test the chemical stability of the organic solvent mixture for use in an automatic feeding apparatus, especially for a coupling tube or an elastic O-ring of the feeding apparatus. The swelling percentages of the sample pieces over time were estimated.

The results showed that the organic solvent compositions of the present invention can be employed in a feeding apparatus having an organic chemical feeding line or O-ring without causing any change in the physical properties of the line or O-ring.

The Wafer Section Pattern After Edge Bead Rinse Treatment

An experiment was conducted by rinsing a wafer on which a photoresist was coated with an organic solvent composition of the present invention, and then viewing the wafer section patterns after rinsing the wafer with an edge bead solvent to remove unwanted photoresist from the edges and back of the wafer.

Several photoresists of a designated thickness were coated on the wafer, namely, SS01A9 (Smitomo Chemical Co., Ltd.) Of 10,500 Å, TSMGamma-i500 (Tokyo Oka Kokyo of 16,300 Å and MCPGamma-i7010N of 25,000 Å, respectively. The wafers were then soft-baked for 60 seconds at 107° C. Then the organic solvent composition comprising 80 g of ethyl lactate and 20 g of Gamma-Butyro Lactone was sprayed under a spray pressure of 0.6 Kg toward a wafer rotating at 3,000 rpm. To examine the rinse characteristics, wafer surfaces which were treated with an edge bead rinse were photographed by an optical microscope and enlarged ten times. See FIG. 5A for SS01A9, FIG. 5B for TSMGamma-i500 an FIG. 5C for MCPGamma-i7010N).

Figure 5:
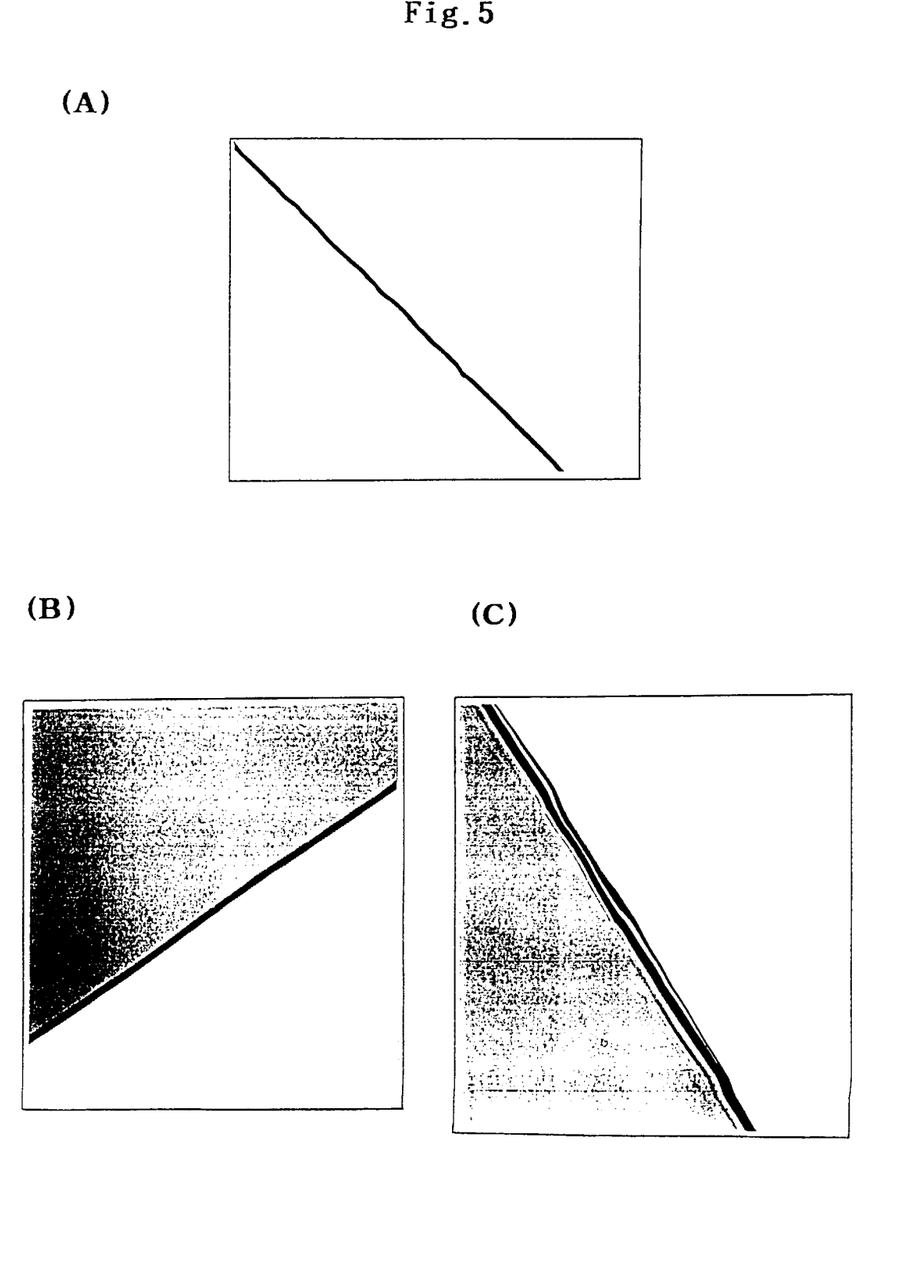
FIG. 5A, 5B and 5C are optical microscope photographs of wafers coated with either SS01A9 (FIG. 5A), TSMGamma-i500 (FIG. 5B), or MCPGamma-i7010N) (FIG. 5C) and rinsed with an edge bead rinse composition of 80 g ethyl lactate and 20 g gamma-butyro lactone.
FIG. 5D is a flow chart depicting a processing sequence of the rework process for removing all of the photoresist from a wafer according to the present invention.

As shown in FIGS. 5A through 5C, the thinner compositions of the present invention were clearly effective in rinsing the surface of the wafer with a high linearity. After rinsing with the 80:20 EL:GBL mixture, the wafers displayed no erosion or photoresist tailing. These results show that the compositions of the present invention are suitable for rinsing the unwanted photoresist from a wafer.

Thinner Compositions Comprising a Mixture of Either (EL)+(EEP), or (EL)+(EEP)+(GBL)

The thinner compositions of the present invention also comprise a mixture of 60 to 80 weight percent of ethyl lactate (EL) and 40 to 20 weight percent of ethyl-3-ethoxy propionate (EEP). These mixtures have a viscosity in the range of 1.0 to 2.0 cps, and preferably in the range of 1.3 to 1.9 cps.

In a preferred embodiment, ethyl lactate (EL) and ethyl-3-ethoxy propionate (EEP) is of a very high purity suitable for the semiconductor class and the VLSI (Very Large Scale Integration) class, and has been filtered through a 0.2 μm filter.

The ethyl-3-ethoxy propionate (EEP) exists in liquid phase at room temperature, and it is used as an intermediate for of vitamins or certain other chemicals. There is no report that EEP is toxic to humans. The physical properties of the ethyl-3-ethoxy propionate (EEP) are as follows: density 0.95 g/cm$^3$, boiling point 170.1° C., ignition point (measured by open cup) 82.2° C., and viscosity (25° C.) 1.20 cps.

In order to increase the solubility rate of a mixture of EL and EEP without greatly changing the volatility or viscosity, τ-butyro lactone (GBL) is added to the mixture.

The compositions of the present invention comprise a mixture of 10 to 70 weight percent of ethyl lactate (EL), 80 to 30 weight percent of ethyl-3-ethoxy propionate (EEP), and less than or equal to 10 weight percent of τ-butyro lactone (GBL).

Preferably, the composition comprises a mixture of 20 to 60 weight percent of ethyl lactate (EL), 72 to 39 weight percent of ethyl-3-ethoxy propionate (EEP), and 1 to 8 weight percent of τ-butyro lactone (GBL).

In more preferred embodiments, the composition comprises a mixture of 20 to 40 weight percent of ethyl lactate (EL), 74 to 58 weight percent of ethyl-3-ethoxy propionate (EEP), and 2 to 6 weight percent of τ-butyro lactone (GBL); and 17–23 weight percent EL, 70–80 weight percent EEP, and 3–7 weight percent GBL.

The various embodiments of the present invention comprising a mixture of EL:EEP:GBL have been evaluated to determine their respective solubility, volatility, and viscosity.

Solubility Rate of Thinners for the Photoresist

The solubility rate of each thinner composition of the present invention and of other commercially available thinners was determined for the various commercially available photoresists including DSAM-200 and DPR-2053. Each photoresist was coated onto a silicon wafer at a thickness of between 12,000 Å and 32,000 Å. The coated wafer was then soft baked at a temperature of 100 to 110° C. for at least 90 seconds. A DRM was used as a measuring tool. The experimental results are shown in Tables 5 and 6, respectively.

TABLE 5

Solubility Rate of Each Thinner for the Photoresist (DSAM-200)
[Coated thickness: 15,000Å; soft bake condition: 100° C., 90 sec]

| Type of Thinner | Solubility Rate (Å/s) |
|---|---|
| EL:EEP 70:30 | 1,126 |
| EL:EEP 60:40 | 1,270 |
| EL:EEP 50:50 | 1,350 |
| EL:GBL:EEP 60:2:38 | 1,224 |
| EL:GBL:EEP 60:5:35 | 1,336 |
| EL:GBL:EEP 50:5:45 | 1,394 |
| EL:GBL:EEP 40:5:55 | 1,650 |
| EL:GBL:EEP 30:5:65 | 1,685 |
| EL:GBL:EEP 20:5:75 | 1,690 |
| EL | 942 |
| GBL | ≧4,000 |
| EEP | 1,780 |
| ECA | 1,989 |
| EL:GBL 80:20 | 2,350 |

Table 5 shows that for a mixture of ethyl lactate (EL) and ethyl-3-ethoxy propionate (EEP), the solubility rate of the photoresist increases as the content of ethyl-3-ethoxy propionate (EEP) increases. In the case of the composition comprising ethyl lactate (EL), τ-butyro lactone (GBL), and ethyl-3-ethoxy propionate (EEP), the solubility rate of the photoresist increases as the content of τ-butyro lactone (GBL) and ethyl-3-ethoxy propionate (EEP) increases. These results show that the solubility rate of the various compositions is adjustable and a predetermined solubility rate can be attained by manipulating the concentration of the components.

TABLE 6

Solubility Rate of Each Thinner for the Photoresist (DPR-2053)
[Coated thickness: 32,000Å; soft back condition: 110° C., 90 sec.]

| Type of Thinner | Solubility Rate (Å/s) |
|---|---|
| EL:EEP 70:30 | 1,100 |
| EL:EEP 60:40 | 1,250 |
| EL:EEP 50:50 | 1,300 |
| EL:GBL:EEP 60:10:30 | 1,779 |
| EL:GBL:EEP 60:5:35 | 1,934 |
| EL:GBL:EEP 50:5:45 | 2,006 |
| EL:GBL:EEP 40:5:55 | 2,042 |
| EL:GBL:EEP 30:5:65 | 2,079 |
| EL:GBL:EEP 20:5:75 | 2,060 |
| EL:GBL:EEP 10:5:85 | 1,978 |
| EL | 909 |
| GBL | ≧3,500 |
| EEP | 1,613 |
| ECA | 1,900 |
| EL:GBL = 80:20 | 2,004 |

Table 6 shows that the solubility rate of the photoresist increases as the content of τ-butyro lactone (GBL) and ethyl-3-ethoxy propionate (EEP) increases for the composition EL:EEP:GBL. However, if the content of ethyl lactate (EL) is less than 20 weight percent, the solubility rate is somewhat reduced. These results show that the solubility rate can be adjusted and a predetermined solubility rate can be achieved by manipulating the concentration of the components.

Volatility of Thinners

One milliliter of various thinners was dropped onto an uncoated wafer by using a general spin coater that is widely used in the process of preparing semiconductors. The wafer was then rotated at various speeds in the range of 1,000 to 5,000 rpm, to measure the time at which the thinner was completely evaporated to the edge portion of the wafer. The results are shown in Table 7.

TABLE 7

Volatility of Thinner on Wafer (unit: sec)

| Type of Thinner | Revolution Rate (rpm) | | | | |
|---|---|---|---|---|---|
| | 5,000 | 4,000 | 3,000 | 2,000 | 1,000 |
| EL:EEP 70:30 | 7 | 9 | 17 | 40 | 140 |
| EL:EEP 60:40 | 7 | 9 | 16 | 35 | 135 |
| EL:EEP 50:50 | 6 | 8 | 14 | 32 | 120 |
| EL:GBL:EEP 60:5:35 | 7 | 11 | 15 | 33 | 124 |
| EL:GBL:EEP 50:5:45 | 7 | 11 | 17 | 36 | 133 |
| EL:GBL:EEP 40:5:55 | 7 | 12 | 20 | 38 | 141 |
| EL:GBL:EEP 30:5:65 | 7 | 11 | 20 | 38 | 144 |

TABLE 7-continued

Volatility of Thinner on Wafer (unit: sec)

| Type of Thinner | Revolution Rate (rpm) | | | | |
|---|---|---|---|---|---|
| | 5,000 | 4,000 | 3,000 | 2,000 | 1,000 |
| EL:GBL:EEP 20:5:75 | 7 | 11 | 20 | 39 | 145 |
| EL | 6 | 8 | 14 | 31 | 120 |
| GBL | 58 | 71 | 131 | — | — |
| EEP | 6 | 9 | 17 | 35 | 138 |
| ECA | 4 | 6 | 13 | 24 | 88 |
| EL:GBL 80:20 | 29 | 43 | 87 | 124 | 420 |

Table 7 shows that the thinner compositions according to the present invention, comprising ethyl lactate (EL) and ethyl-3-ethoxy propionate (EEP), rapidly evaporate at a rate that is close to that for ethyl lactate (EL) or ethyl-3-ethoxy propionate (EEP) alone. Further, all of the EL:EEP thinners of the present invention thoroughly evaporate even at the edge portion of the wafer. Surprisingly, when τ-butyro lactone (GBL), which has a very low volatility but an excellent solubility rate for the photoresist, is mixed in the thinner, the composition of EL:EEP:GBL rapidly evaporates at an evaporation rate that is close to that of either ethyl lactate or ethyl-3-ethoxy propionate, alone. The EL:EEP:GBL thinners also thoroughly evaporate even at the edge portion of the wafer. The results also show that the volatility of the thinner increases as the content of ethyl lactate increases permitting the volatility rate to be adjusted to a predetermined level.

Viscosity of Thinners

The viscosity of each thinner used in the embodiments of the present invention was measured and the results are shown in Table 8. Viscosity is critical to properly adjust the spraying pressure in the spraying system and the nozzles for spraying the thinner because a viscosity that is too high may cause a needless loss of pressure.

TABLE 8

Viscosity of Each Thinner (unit :cps, at 25° C.)

| Type of Thinner | Viscosity (cps) |
|---|---|
| EL:EEP 70:30 | 1.82 |
| EL:EEP 60:40 | 1.75 |
| EL:EEP 50:50 | 1.70 |
| EL:GBL:EEP 60:5:35 | 1.74 |
| EL:GBL:EEP 50:5:45 | 1.65 |
| EL:GBL:EEP 40:5:55 | 1.50 |
| EL:GBL:EEP 30:5:65 | 1.48 |
| EL:GBL:EEP 20:5:75 | 1.40 |
| EL | 2.38 |
| GBL | 1.77 |
| EEP | 1.20 |
| ECA | 1.32 |
| EL:GBL = 80:20 | 2.25 |

Table 8 shows that the thinner compositions of the present invention have a low viscosity comparable to ethyl lactate (EL) alone even after mixing ethyl lactate (EL) with ethyl-3-ethoxy propionate (EEP). This low viscosity assures that an excessive loss of pressure will not occur when the thinner is sprayed through the nozzles. The results also show that considerably low viscosity can be maintained even when τ-butyro lactone (GBL), which has a relatively high viscosity but an excellent admixed solubility rate for the photoresist, is added to EL and EEP. The results show that adding GBL to a mixture of EL and EEP will not cause an excessive loss of pressure when spraying the thinner through the nozzles. The results also show that the viscosity decreases as the amount of ethyl-3-ethoxy propionate (EEP) increases, whether the composition is EL:EEP or EL:EEP:GBL. Thus, by adjusting the amount of EEP in the thinner composition, a predetermined viscosity can be achieved.

Rework Process of Wafer for Manufacturing Semiconductor Devices

Figure 5D:
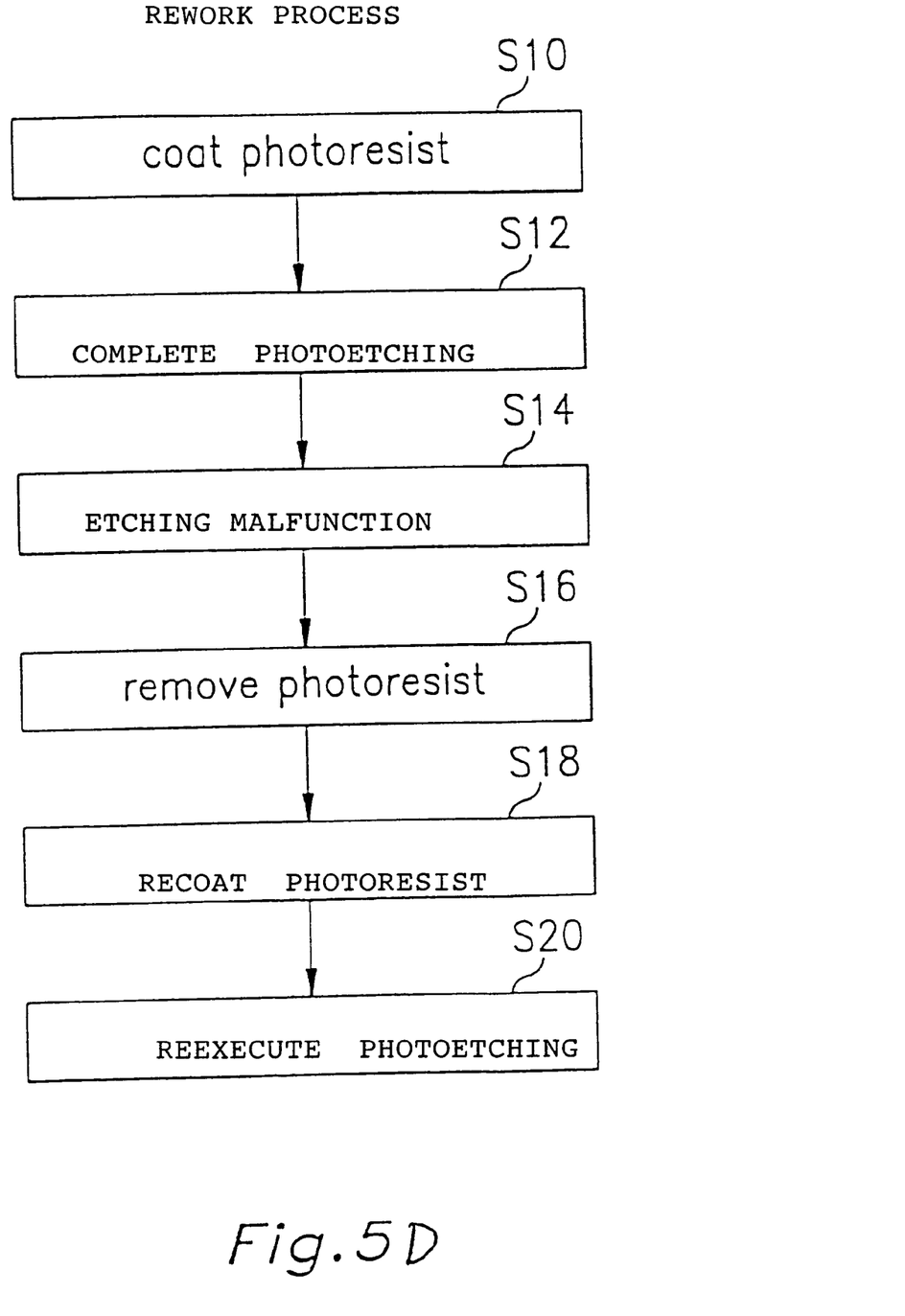

FIG. 5D is a processing sequence for a rework process for removing the entire photoresist when there is a malfunction or etching failure during the photoetching process. In a first step, a photoresist is coated onto a semiconductor substrate (S10) to form of a predetermined pattern, then the coated substrate is photoetched (S12).

If a malfunction (S14) occurs during the photoetching process causing an etching failure, such as exposure failure or a pattern failure, the rework process is executed to remove all of the photoresist that was unsuccessfully coated onto the wafer during the photoetching process (S16).

A new layer of photoresist is then recoated onto the wafer to form a predetermined pattern (S18), and conventional photoetching is reexecuted (S20).

Figure 6:
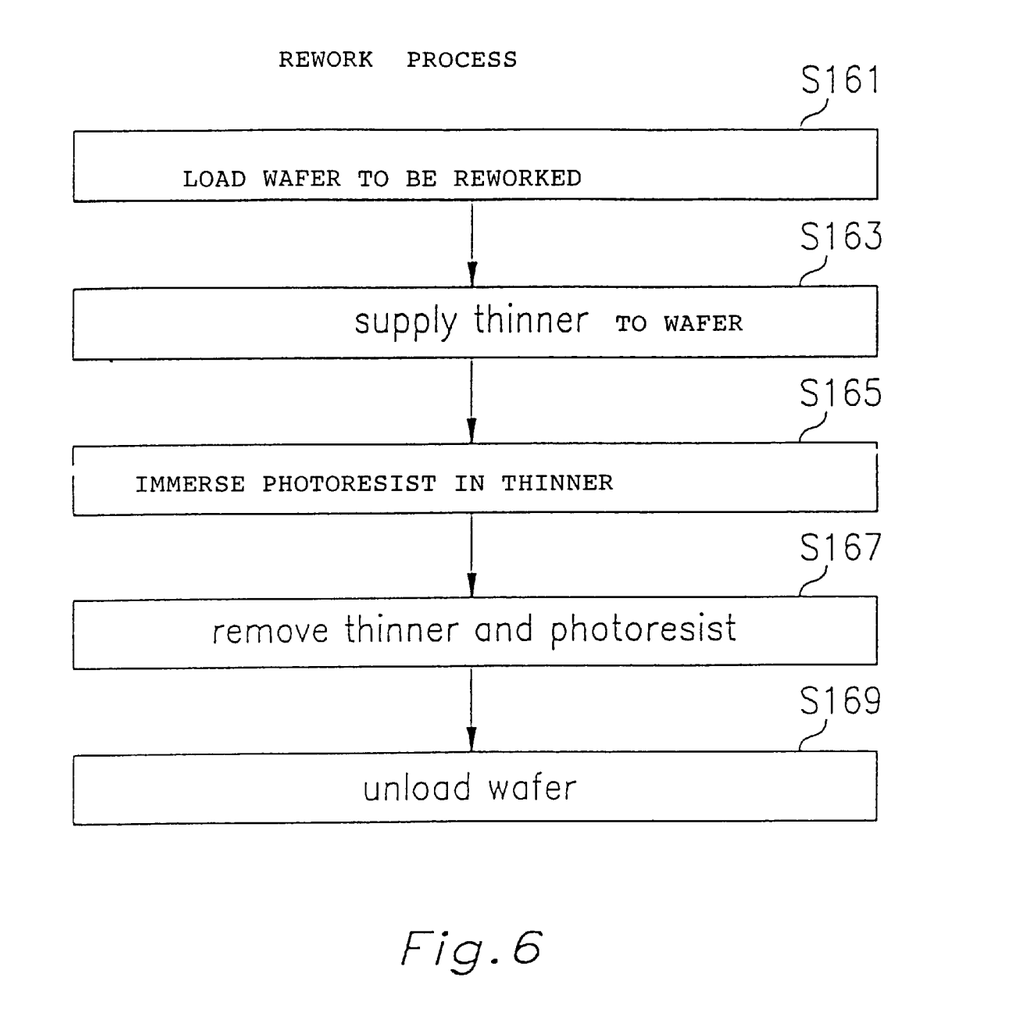
FIG. 6 is a flow chart depicting a processing sequence showing one embodiment of the rework process of FIG. 5.
Figure 8:
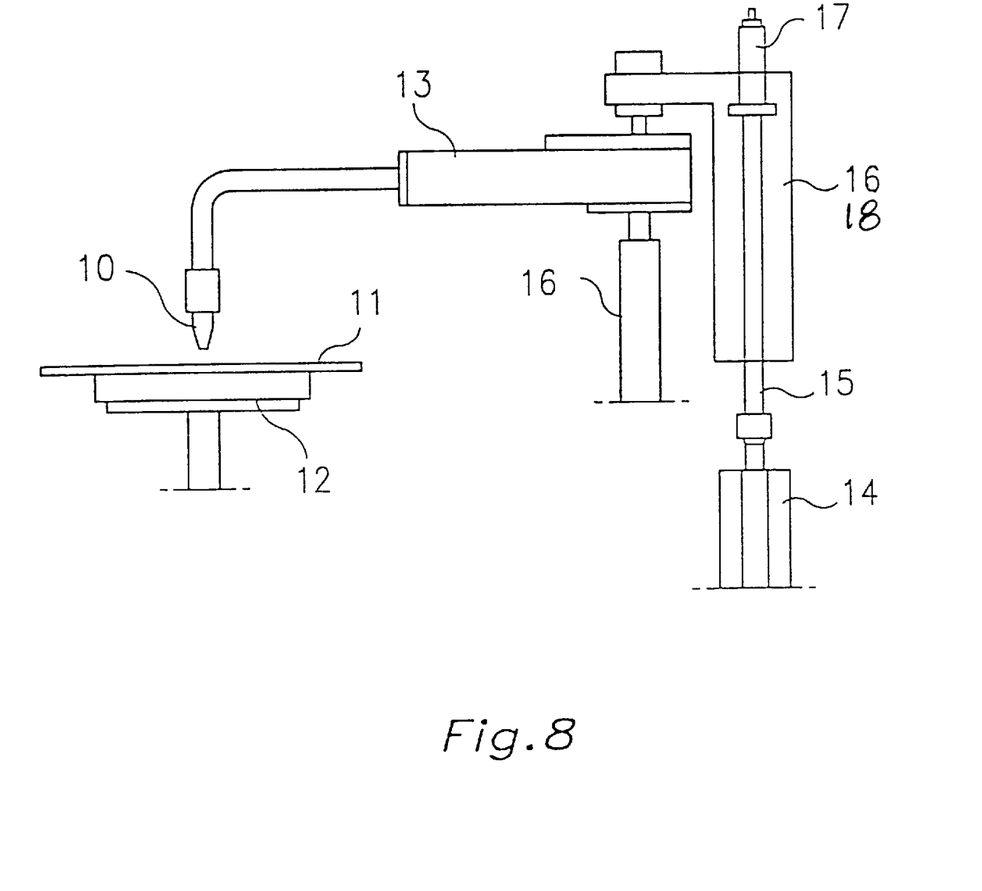
FIG. 8 is a schematic diagram showing the rework apparatus for carrying out the rework method for manufacturing semiconductor devices according to the present invention.

FIG. 6 is a processing sequence for the rework process according to one embodiment of the present invention, and FIG. 8 shows a rework apparatus for carrying out the rework process.

Referring to FIG. 8, a wafer 11 is fixed by vacuum-suction onto a rotatable vacuum chuck 12 similar to a typical spin coater to coat photoresist. A rotatable arm 13 is connected to a support 16 for supporting a nozzle 10 which supplies the thinner composition of the present invention. The nozzle 10 is placed over the wafer to be reworked by the rotation operation of the arm 13. A shaft 15 is placed between a second vertically reciprocating support 18 and a cylinder 14 mounted on a certain fixing member (not shown). The shaft 15 connects the support 18 and the cylinder 14. A fixing nut 17 is used to mount the support 16 to the cylinder 14.

As described above, if a malfunction occurs during the photoetching process causing an etching failure, such as exposure failure or a pattern failure, the rework process of the present invention is executed to remove all of the photoresist that was unsuccessfully coated onto the wafer during the photoetching process.

With reference to FIG. 6 and FIG. 8, the wafer 11 to be reworked is loaded onto the vacuum chuck 12 of FIG. 6 (S161). After the waver is mounted, thinner composition is supplied to the wafer surface that has the photoresist formed thereon, through the nozzle 10 (S163). The thinner compounds of the present invention uniformly dissolve the photoresist. The solubility rate of the photoresist across the entire wafer is optimized by rotating the vacuum chuck with the wafer fixed thereon at a low speed of less than about 100 rpm so that the thinner supplied to the wafer center is sufficiently spread to the wafer edge.

The thinner composition is typically left on the wafer for about 5 minutes or less to maintain the photoresist immersed in the thinner composition (S165). The duration of exposure to the thinner can be varied according to the amount and thickness of the unwanted photoresist. Then the vacuum chuck 12 is rotated at high speed for at least about 30 seconds, preferably 30 to 60 seconds, in order to remove the photoresist that was dissolved by the thinner composition (S167). The wafer is unloaded from the vacuum chuck 12 upon completion of the rework process (S169).

The thinner compounds of the present invention can be used with commercially available photoresists, including but not limited to CRK-2, CRSS-3, SS01A9, TSMGamma-i500, MCPGamma-i7010N, and MCPR-4000D3, etc., to rapidly and efficiently remove these photoresists from the surface of a wafer. Unnecessary photoresist can also be removed from the front, edge or back of a wafer by immersing the entire wafer into the thinner compositions of the present invention, or by spraying the thinner onto the back of the wafer.

In a preferred embodiment of the present invention, the thinner compositions used in the rework process described above comprise from about 10–70 weight percent of EL, 30–80 weight percent of EEP, and less than or equal to 10 weight percent of GBL; or 70 to 80 weight percent of ethyl-3-ethoxy propionate (EEP), 17 to 23 weight percent of ethyl lactate (EL), and 3 to 7 weight percent of τ-butyro lactone (GBL). In another preferred embodiment, the thinner comprises a mixture of 75 weight percent of ethyl-3-ethoxy propionate (EEP), 20 weight percent of ethyl lactate, and 5 weight percent of τ-butyro lactone (GBL). The viscosity of these thinner compositions is between about 1.0 to 2.0 cps, and preferably is about 1.3 to 1.9 cps.

In still another embodiment, the thinner composition comprises 40 to 20 weight percent of ethyl-3-ethoxy propionate (EEP), and 60 to 80 weight percent of ethyl lactate (EL). In still another embodiment, the thinner comprises 90 to 60 weight percent of ethyl lactate (EL) and 10 to 40 weight percent of τ-butyro lactone (GBL). The viscosity of the thinner composition is in a range of from about 1.0 to 2.0 cps, preferably from about 1.3 to 1.9 cps.

Figure 9:
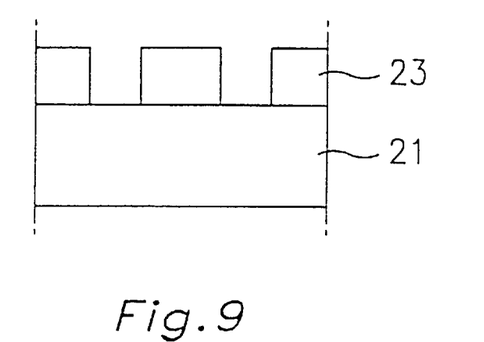
FIG. 9 is a cross-sectional view showing one embodiment of the method of manufacturing semiconductor devices according to the present invention.

FIGS. 5 and 6 show the processing steps of the rework process of the present invention in detail. FIG. 9 shows a cross-sectional view of a wafer that must be reworked due to an etching failure that occurred in the photoresist 23 that was directly coated onto the semiconductor substrate 21.

Figure 10:
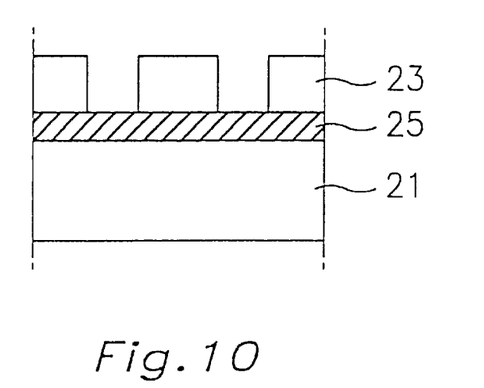
FIG. 10 is a cross-sectional view showing another embodiment of the method of manufacturing semiconductor devices according to the present invention.

FIG. 10 shows a cross-sectional view of the wafer submitted for rework due to an etching failure that occurred during the photoetching process after a photoresist 23 is coated onto the insulating layer 25 over semiconductor substrate 21 for formation of a predetermined pattern. The insulating layer 25 may be an oxide layer or a nitride layer.

Figure 11:
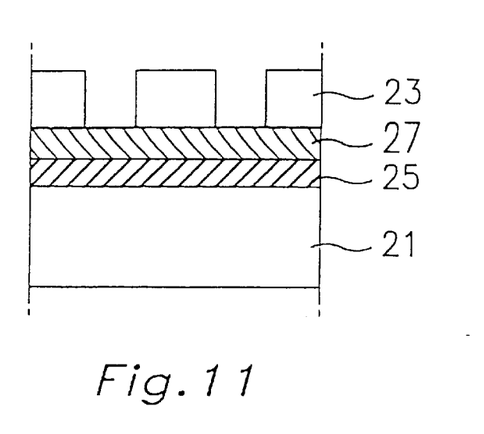
FIG. 11 is a cross-sectional view showing still another embodiment of the method of manufacturing semiconductor devices according to the present invention.

FIG. 11 shows a cross-sectional view of a wafer that must be reworked due to an etching failure that occurred during the photoetching process after forming an insulating layer 25 on a semiconductor substrate 21, then forming a metallic layer 27 over the insulating layer 25, and finally forming a photoresist 23 over the metallic layer 27. The metallic layer 27 may be an aluminum layer, for example.

According to the present invention, the rework process can be carried out using the same thinner composition whether the photoresist is directly coated onto the semiconductor substrate, or the photoresist is coated onto an insulating layer or a metallic layer. This represents a significant improvement over conventional thinners.

The rework process using the thinner compositions of the present invention produces a yield that is comparable to the yield obtained using conventional thinners such as N-butyl acetate.

TABLE 9

Results of the Rework Process (unit: %)

| | Normal Process | Rework 1 times (by this invention) | Rework 5 times (by this invention) | Conventional Rework 1 times | Conventional Rework 2 times |
|---|---|---|---|---|---|
| Sample 1 | 51.4 | 62.4 | 63.3 | 62.3 | 64.3 |
| Sample 2 | 76.8 | 80.2 | 85.2 | 79.4 | 81.5 |

Photoresist used in the above samples: MCPR-4000D3

Table 9 shows the results of the rework process for two samples that have a metallic layer of Aluminum+0.1 wt % Silicon+0.5 wt % Copper formed on a semiconductor substrate. The results confirm that the yield of the rework process according to the present invention is similar to the conventional yield. The results in Table 9 show the GOOD DIE yield of 64M DRAM. By Normal Process is meant the normal run without the rework process. A thinner composition of the present invention is used in the rework process; it is a mixture of 75 wt % EEP+20 wt % EL+5 wt % GBL. The thinner used in the conventional rework process is NBA.

In another experiment, either a nitride layer or a metallic layer was formed on a semiconductor substrate that had no pattern. A photoresist was then coated over the nitride or metallic layer. The rework process was performed using a thinner composition of the present invention that is a mixture of 75 wt % EEP+20 wt % EL+5 wt % GBL. The results show that the contact angle, illustrating the amount of the organic material remaining on the nitride or metallic layer, is 41.1° to 43.2°. The contact angles are similar whether a metallic or nitride layer is used. This is lower than the amount observed in the conventional method which was about 54.2°. The organic material that remains on the nitride or metallic layer comes from the photoresist and includes a carbon component and an oxygen component. The contact angle is measured by supplying water on the surface of the nitride or metallic layer after the photoresist has been removed.

The surface of semiconductor wafers that were reworked by the method of the present invention was observed by Scanning Electron Microscopy which showed that the surface condition of the semiconductor substrate reworked according to the present invention was similar to that of a wafer reworked using conventional methods.

The scanning microscope analysis of the surface of a nitride layer or a metallic layer showed that several Å of photoresist still remained on the surface when the conventional rework process was used. By contrast, no photoresist remained when the rework process of the present invention was used. Therefore, the rework process of the present invention provides a yield similar to that of the conventional rework process, while improving the amount of photoresist that is removed.

Figure 12:
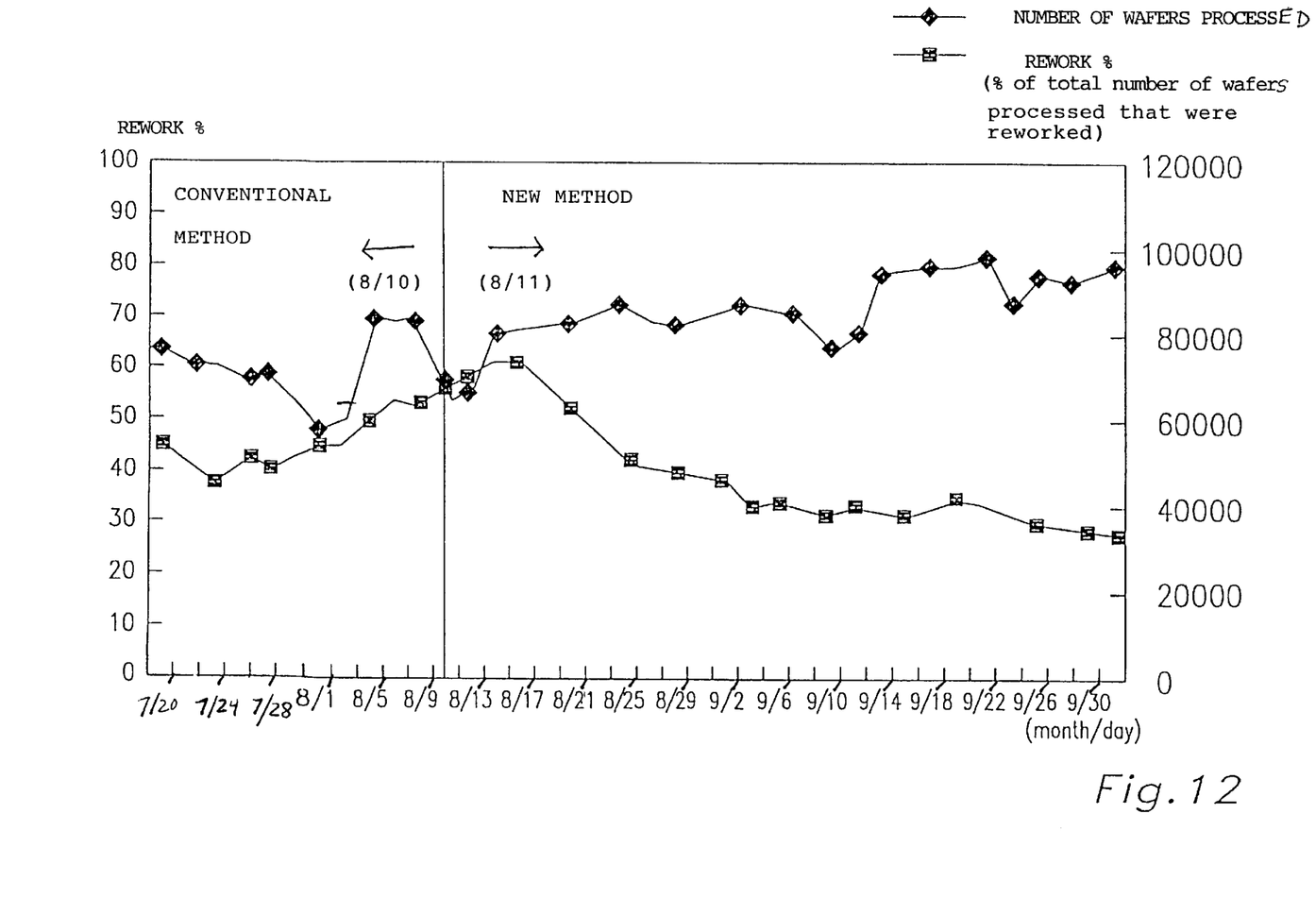
FIG. 12 is a graphical representation showing the number of wafers processed and the percentage (%) of the total number that were reworked using the conventional method and the rework process according to one embodiment of the present invention.

FIG. 12 is a graphic representation showing the number of wafers processed using a conventional rework process (corresponding to the dates July 20–August 10) and the percent of the total number of wafers processed that were reworked on a given day (Rework %) using a mixture of 75 wt % EEP+20 wt % EL+5 wt % GBL. The number of wafers processed using the rework method of the present invention which was begun on August 11 is also given along with the corresponding Rework %.

According to the present invention, the rework process can be carried out using any thinner composition of the present invention, irrespective of the kinds of layers that have been applied to the semiconductor substrate. As is shown in FIG. 12, a greater number of wafers can be processed using the present rework method as compared to conventional methods. The results in FIG. 12 also show that the percentage (%) of the total wafers that must be reworked decreases for the present invention meaning that there are fewer failures using the thinners of the present invention. That is, when comparing the conventional rework process and the rework process of the present invention over the period of about 2 months, which is shown in FIG. 12, the number of treated wafers is increased and the reworking rate is reduced after the August 11, the date the method of the present invention was used. This shows that the productivity is improved using the present invention for reworking a wafer.

Rinsing Process for Semiconductor Device

Figure 7:
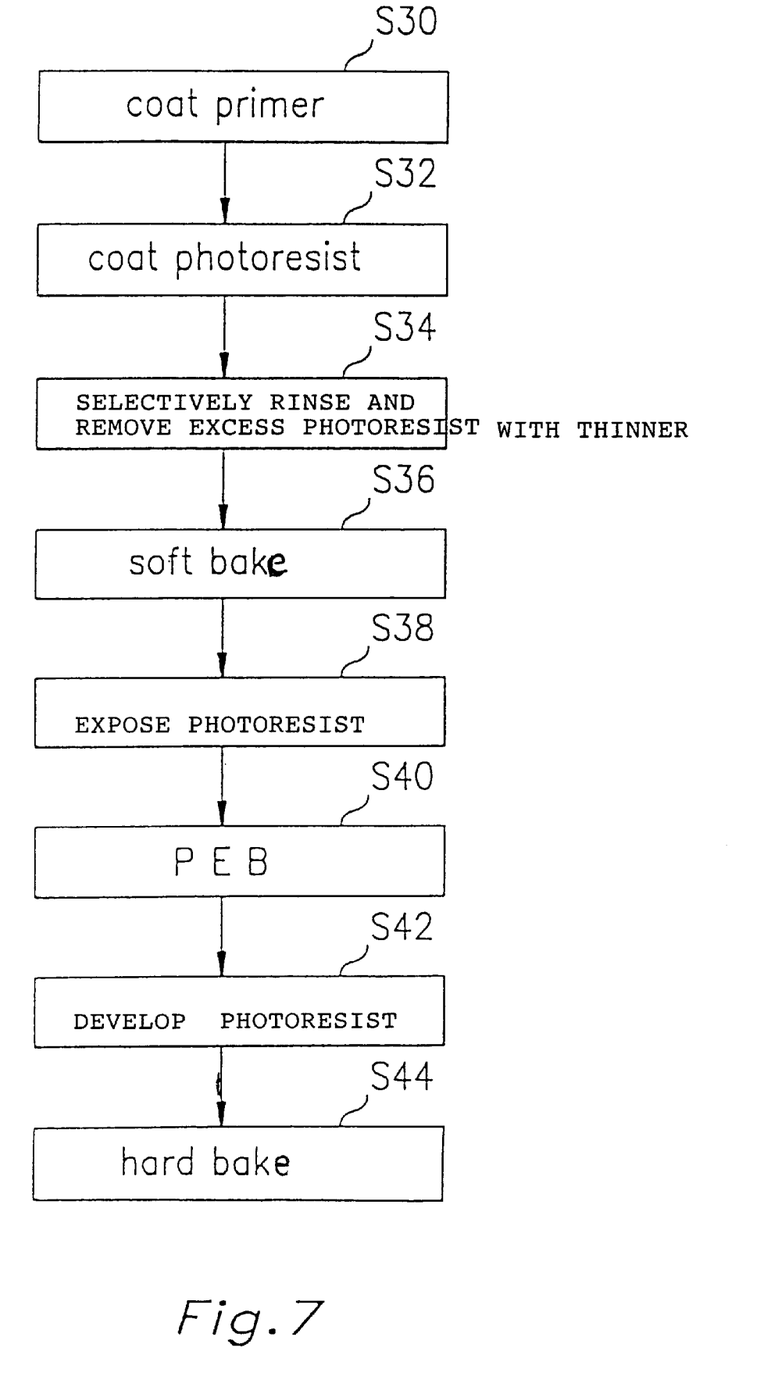
FIG. 7 is a flow chart depicting a processing sequence showing one embodiment of the method of manufacturing semiconductor devices according to the present invention.

FIG. 7 shows a processing sequence of one embodiment of the rinsing process in the semiconductor device fabrication process according to the present invention.

Referring to FIG. 7, in a preferred embodiment a primer is coated on the semiconductor substrate in order to improve the adhesiveness of the photoresist that is coated onto the semiconductor substrate (S30). The primer can be directly coated onto a semiconductor substrate, or onto a specific insulating layer or a metallic layer. Hexamethylenedisilazane (HMDS) is one example of a suitable primer. A photoresist is then coated onto the primer in order to form a predetermined pattern (S32) on the wafer.

In another preferred embodiment, any photoresist that was unnecessarily coated onto the wafer, such as at the edges or on the back side of the wafer, is removed and rinsed away by spraying a thinner composition of the present invention. In this embodiment, a thinner mixture of 70 to 80 weight percent of ethyl-3-ethoxy propionate (EEP), 17 to 23 weight percent of ethyl lactate (EL), and 3 to 7 weight percent of τ-butyro lactone (GBL), is applied onto the edges and back of the wafer (S34).

In another embodiment, the thinner comprises a mixture of 75 weight percent of ethyl-3-ethoxy propionate (EEP), 20 weight percent of ethyl lactate (EL), and 5 weight percent of τ-butyro lactone (GBL).

In other embodiments of the present invention, the thinner comprises a mixture of 40 to 20 weight percent of ethyl-3-ethoxy propionate (EEP), and 60 to 80 weight percent of ethyl lactate (EL); or a mixture of 60 to 90 weight percent of ethyl lactate (EL), and 10 to 40 weight percent of τ-butyro lactone (GBL).

After rinsing the unnecessarily coated photoresist from the edges and backside of the wafer, the wafer is soft-baked in order to improve the adhesiveness of the photoresist to the wafer and to remove the solvent (S36).

As FIG. 7 shows, the wafer then is exposed by selectively projecting light onto the wafer through a mask or reticle in order to form a predetermined pattern on the photoresist layer (S38). Then, a Post-Exposure Bake (PEB) is carried out in order to recover the stability of the chemical structure to prevent an incorrect pattern from being formed by the unnecessary exposure of the exposure interface to scattered ultraviolet light (S40).

The photoresist undergoes a photochemical reaction by the exposure to light. The exposed photoresist is then selectively removed by developing (S42) the photoresist layer then by forming a predetermined pattern of photoresist on the wafer. The wafer is then hard baked in order to stabilize the pattern by hardening the photoresist.

Once the photoresist pattern has been formed and stabilized, a typical etching process or ion-injection process is executed according to the photoresist pattern.

An advantage of the thinner compositions of the present invention is that they are useful in both the rework process to remove all of the photoresist from the wafer, and in the rinsing process for removing unwanted photoresist from the edges and back of the wafer. The thinners of the present invention are nontoxic and have a suitably high volatility, low viscosity, and sufficient solubility rate for the photoresist.

The rework process according to the present invention can be carried out using the same thinner composition irrespective of the formation of metallic or nitride layers during in the semiconductor device fabrication process. The thinners of the present invention therefore increase productivity because the same thinner composition and the same rework apparatus can be used in both the rework process and the rinsing process which saves time and increases uniformity.

The present invention is not limited to the embodiments set forth above, and it is clearly understood that many variations may be made within the scope of the present invention by anyone skilled in the art.

What is claimed is:

1. A rework method for removing photoresist from a wafer for manufacturing semiconductor devices, the method comprising:

coating the photoresist onto a metallic layer formed on a semiconductor substrate;

photoetching the photoresist;

examining the wafer to determine whether an etching failure has occurred;

if an etching failure is detected, removing the photoresist coated on the semiconductor substrate by applying a thinner composition to the photoresist, the thinner consisting essentially of a mixture of ethyl lactate (EL) and τ-butyro lactone (GBL), said removing comprising loading the semiconductor substrate, having the metallic layer and photoresist coated thereon, onto a rotatable vacuum chuck;

supplying the thinner to the photoresist coated on the semiconductor substrate;

maintaining the thinner on the semiconductor substrate for a period of time sufficient to dissolve the photoresist; and removing the dissolved photoresist and the thinner by rotating the vacuum chuck.

2. The rework method of claim 1, wherein the thinner comprises a mixture of 60 to 90 weight percent of ethyl lactate (EL), and 10 to 40 weight percent of τ-butyro lactone (GBL).

3. The rework method of claim 1, wherein the viscosity of the thinner composition is in a range of from about 1.0 to about 2.0 cps.

4. The rework method of claim 1, wherein the supplying comprises supplying the thinner through a nozzle positioned over the center of the semiconductor substrate.

5. The rework method of claim 4, wherein the supplying further comprises rotating the vacuum chuck at a low speed of less than about 100 rpm, such that the thinner supplied to the center of the semiconductor substrate spreads radially outwardly toward an outer periphery of the semiconductor substrate.

6. The rework method of claim 5, wherein the removing comprises rotating the vacuum chuck for at least 30 seconds at a speed sufficient to remove all dissolved photoresist and the thinner.

7. A rework method for removing photoresist from a wafer for manufacturing semiconductor devices, the method comprising:

coating the photoresist onto a metallic layer formed on a semiconductor substrate;

photoetching the photoresist;

examining the wafer to determine whether an etching failure has occurred;

if an etching failure is detected, removing the photoresist coated on the semiconductor substrate by applying a thinner composition to the photoresist, the thinner consisting essentially of a mixture of ethyl-3-ethoxy propionate (EEP), and ethyl lactate (EL), said removing comprising loading the semiconductor substrate, having the metallic layer and photoresist coated thereon, onto a rotatable vacuum chuck;

supplying the thinner to the photoresist coated on the semiconductor substrate;

maintaining the thinner on the semiconductor substrate for a period of time sufficient to dissolve the photoresist; and removing the dissolved photoresist and the thinner by rotating the vacuum chuck.

8. The rework method of claim 7, wherein the thinner composition further comprises τ-butyro lactone (GBL).

9. The rework method of claim 8, wherein the thinner comprises a mixture of 70 to 80 weight percent of ethyl-3-ethoxy propionate (EEP), 17 to 23 weight percent of ethyl lactate (EL), and 3 to 7 weight percent of τ-butyro lactone (GBL).

10. The rework method of claim 7, wherein the viscosity of the thinner is in a range of from about 1.0 to about 2.0 cps.

11. The rework method of claim 7, wherein the metallic layer is an aluminum layer.

12. The rework method of claim 7, wherein the supplying comprises supplying the thinner through a nozzle positioned over the center of the semiconductor substrate.

13. The rework method of claim 12, wherein the supplying further comprises rotating the vacuum chuck at a low speed of less than about 100 rpm, such that the thinner supplied to the center of the semiconductor substrate spreads radially outwardly toward an outer periphery of the semiconductor substrate.

14. The rework method of claim 13, wherein the removing comprises rotating the vacuum chuck for at least 30 seconds at a speed sufficient to remove all dissolved photoresist and the thinner.

* * * * *